United States Patent
Yamada et al.

(10) Patent No.: US 11,145,515 B2
(45) Date of Patent: Oct. 12, 2021

(54) MANUFACTURING METHOD OF SEMICONDUCTOR DEVICE WITH ATTACHED FILM

(71) Applicant: DENSO CORPORATION, Kariya (JP)

(72) Inventors: Shuntaro Yamada, Kariya (JP); Akinori Kanda, Kariya (JP); Tetsuo Yoshioka, Kariya (JP); Takashige Nagao, Kariya (JP); Kouichi Miyashita, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/662,329

(22) Filed: Oct. 24, 2019

(65) Prior Publication Data

US 2020/0058510 A1 Feb. 20, 2020

Related U.S. Application Data

(63) Continuation of application No. PCT/JP2018/020005, filed on May 24, 2018.

(30) Foreign Application Priority Data

Jun. 15, 2017 (JP) .............................. JP2017-117856

(51) Int. Cl.
*H01L 21/304* (2006.01)
*H01L 21/78* (2006.01)
*H01L 29/06* (2006.01)

(52) U.S. Cl.
CPC .......... *H01L 21/3043* (2013.01); *H01L 21/78* (2013.01); *H01L 29/0657* (2013.01); *H01L 2221/68327* (2013.01)

(58) Field of Classification Search
CPC ....... H01L 21/78; H01L 21/782; H01L 21/784; H01L 21/82; H01L 21/822
See application file for complete search history.

(56) References Cited

U.S. PATENT DOCUMENTS

| 5,904,548 A * | 5/1999 | Orcutt ................ H01L 21/78 438/462 |
| 2002/0016047 A1 | 2/2002 | Tateishi |
| 2006/0040472 A1* | 2/2006 | Tamura ............... H01L 21/78 438/460 |
| 2007/0155055 A1 | 7/2007 | Yang |

(Continued)

FOREIGN PATENT DOCUMENTS

| JP | H02-088203 A | 3/1990 |
| JP | H06-232255 A | 8/1994 |

(Continued)

*Primary Examiner* — Zandra V Smith
*Assistant Examiner* — Molly K Reida
(74) *Attorney, Agent, or Firm* — Posz Law Group, PLC

(57) ABSTRACT

In a manufacturing method of a semiconductor device including a substrate having a front surface and a rear surface, and a film attached to the rear surface, the film is attached on the rear surface, a rear surface side groove is provided by half-cutting the substrate from the rear surface together with the film, a protective member is attached to the film after the rear surface side groove is provided, and a front surface side groove connected to the rear surface side groove is provided by dicing the substrate from the front surface after the protective member is attached.

9 Claims, 8 Drawing Sheets

(56) References Cited

U.S. PATENT DOCUMENTS

| | | |
|---|---|---|
| 2013/0157414 A1 | 6/2013 | Ho et al. |
| 2016/0042997 A1 | 2/2016 | Takahashi et al. |
| 2016/0056080 A1 | 2/2016 | Takahashi et al. |
| 2016/0211180 A1 | 7/2016 | Takahashi et al. |
| 2016/0211225 A1 | 7/2016 | Masuko et al. |
| 2017/0053830 A1 | 2/2017 | Haimoto et al. |

FOREIGN PATENT DOCUMENTS

| | | |
|---|---|---|
| JP | 2001-127010 A | 5/2001 |
| JP | 2004-193241 A | 7/2004 |
| JP | 2005-012203 A | 1/2005 |
| JP | 2006-237375 A | 9/2006 |
| JP | 2007-042810 A | 2/2007 |
| JP | 2007-073844 A | 3/2007 |
| JP | 2010-123603 A | 6/2010 |
| JP | 2011-159679 A | 8/2011 |
| JP | 2012-169411 A | 9/2012 |
| JP | 2015-119068 A | 6/2015 |
| JP | 2015-185691 A | 10/2015 |
| JP | 2016-225586 A | 12/2016 |

\* cited by examiner

MANUFACTURING METHOD OF SEMICONDUCTOR DEVICE WITH ATTACHED FILM

CROSS REFERENCE TO RELATED APPLICATIONS

The present application is a continuation application of International Patent Application No. PCT/JP2018/020005 filed on May 24, 2018, which designated the U.S. and claims the benefit of priority from Japanese Patent Application No. 2017-117856 filed on Jun. 15, 2017. The entire disclosures of all of the above applications are incorporated herein by reference.

TECHNICAL FIELD

The present disclosure relates to a semiconductor device and a manufacturing method of a semiconductor device.

BACKGROUND

Conventionally, there is known a semiconductor chip to which a die attach film (DAF) is attached.

SUMMARY

According to an aspect of the present disclosure, a manufacturing method of a semiconductor device includes attaching a film on a rear surface of a substrate, providing a rear surface side groove by half-cutting the substrate from the rear surface together with the film, attaching a protective member to the film after the providing the rear surface side groove, and providing a front surface side groove connected to the rear surface side groove by dicing the substrate from a front surface after the attaching the protective member.

According to another aspect of the present disclosure, a semiconductor device includes a substrate having a front surface and a rear surface, and a film attached to the rear surface. In the semiconductor device, an outer peripheral portion of the front surface is recessed from an inner peripheral portion of the front surface and an outer peripheral portion of the rear surface is recessed from an inner peripheral portion of the the rear surface to cause a portion extending from the inner peripheral portion of the front surface to the inner peripheral portion of the rear surface through the outer peripheral portion of the front surface, a side surface of the substrate, and the outer peripheral portion of the rear surface to have a stepped shape, and the film is attached to the inner peripheral portion of the rear surface.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
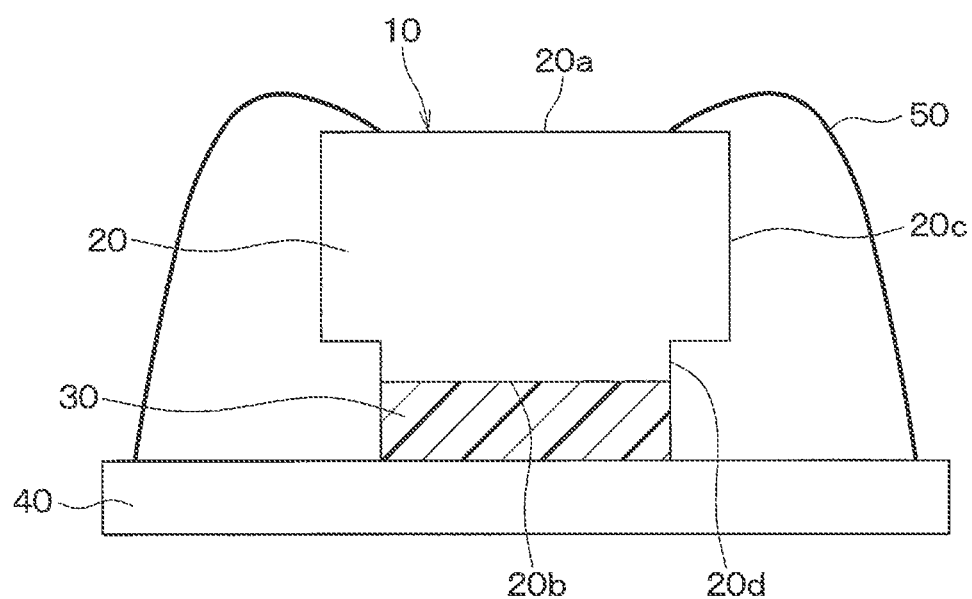
FIG. 1 is a cross-sectional view of a semiconductor device according to a first embodiment.

In an example of a manufacturing method of a semiconductor chip having a DAF, half-cutting is performed from a front surface in a state where a holding adhesive tape is attached to a rear surface of a wafer, and after the holding adhesive tape has been attached to the front surface of the wafer, the wafer is ground from a rear surface of the wafer to divide the wafer into units of chips. Then, a DAF is attached to the rear surface of the wafer divided into the chip units, and a portion of the DAF which is not attached to the wafer is broken by a tensile force to manufacture the semiconductor chip having the DAF attached to the rear surface.

However, in the above-described method, it is necessary to cut the DAF into the same shape as a shape of the wafer and accurately attach the DAF to the wafer. In addition, since the DAF is attached to the front surface of the wafer in the state where the holding adhesive tape is attached, the fluidity of the adhesive layer of the holding adhesive tape is increased by heating the wafer at the time of attaching the DAF, so that the adhesive force is increased and peeling of the holding adhesive tape may become difficult.

In addition, when the DAF is broken by the tensile force, there is a possibility that sagging occurs in the holding adhesive tape. As a method of avoiding the sagging, for example, a method of attaching the DAF cut to the same size as the shape of the chip to the rear surface of the chip can be considered. However, in the above method, as the chip is miniaturized, it becomes difficult to cut the DAF according to the size of the chip and attach the DAF to the chip.

In another manufacturing method, the DAF is attached to the wafer before the wafer is divided into chips, and the DAF is cut for each wafer by dicing instead of breaking by tensile force.

However, for example, when the DAF is attached to the rear surface of the wafer, an outer surface of the DAF is attached to the holding adhesive tape, and dicing is performed from the front surface of the wafer, the DAF is supported by the holding adhesive tape which is likely to be deformed. Then, when the dicing blade abuts against the DAF, the DAF deforms, the DAF adheres to an uneven surface of the dicing blade, and cutting whiskers of the DAF occur.

When the cutting whiskers are present, the cutting whiskers may be submerged under the chip to hinder a pickup, or the cutting whiskers may come in contact with a wiring pattern to cause a short circuit. In a case where the semiconductor chip includes the sensor element, if the cutting whiskers are submerged between the mounting substrate and the semiconductor chip at the time of mounting the semiconductor chip on the mounting substrate, a horizontality of the sensor is lowered and a sensor accuracy is lowered.

According to an aspect of the present disclosure, a manufacturing method of a semiconductor device including a substrate having a front surface and a rear surface, and a film attached to the rear surface, includes attaching the film on the rear surface, providing a rear surface side groove by half-cutting the substrate from the rear surface together with the film, attaching a protective member to the film after the providing the rear surface side groove, and providing a front surface side groove connected to the rear surface side groove by dicing the substrate from the front surface after the attaching the protective member.

In this manner, when the substrate is half-cut from the rear surface together with the film attached to the rear surface of the substrate, the film is cut while being supported by the substrate that is hard, so that the occurrence of cutting whiskers of the film can be restricted.

According to another aspect of the present disclosure, a semiconductor device includes a substrate having a front surface and a rear surface, and a film attached to the rear surface. In the semiconductor device, an outer peripheral portion of the front surface is recessed from an inner peripheral portion of the front surface and an outer peripheral portion of the rear surface is recessed from an inner peripheral portion of the rear surface to cause a portion extending from the inner peripheral portion of the front surface to the inner peripheral portion of the rear surface through the outer peripheral portion of the front surface, a side surface of the substrate, and the outer peripheral portion of the rear surface to have a stepped shape, and the film is attached to the inner peripheral portion of the rear surface.

Such a semiconductor device may be formed by attaching the film to the rear surface of the substrate, half-cutting the substrate together with the film from the rear surface side to shape the rear surface side groove, and then performing dicing multiple times by changing the width of the dicing blade from the front surface of the substrate to form a stepped front surface side groove connected to the rear surface side groove.

In this manner, when the substrate is half-cut from the rear surface together with the film attached to the rear surface of the substrate, the film is cut while being supported by the substrate that is hard, so that the occurrence of cutting whiskers of the film can be restricted.

Embodiments of the present disclosure will be described below with reference to the drawings. In the following embodiments, the same reference numerals are assigned to parts that are the same as or equivalent to each other for description.

First Embodiment

A first embodiment will be described. As shown in FIG. 1, a semiconductor device according to the present embodiment includes a semiconductor chip 10, a DAF 30 which is attached to a substrate 20 included in the semiconductor chip 10, a mounting substrate 40, and bonding wires 50.

In the semiconductor chip 10, a semiconductor device (not shown) such as a sensor element is formed on the substrate 20 made of, for example, Si. Pads (not shown) are formed on a front surface 20a of the substrate 20, and the bonding wires 50 connect the pads to the mounting substrate 40.

The DAF 30 is attached to a rear surface 20b of the substrate 20, and the semiconductor chip 10 is fixed to the mounting substrate 40 by the DAF 30. In the present embodiment, recess portions 20d are provided in corners between the rear surface 20b and side surfaces 20c of the substrate 20, and an outer peripheral end portion of the rear surface 20b has a shape recessed from an inner peripheral portion. The DAF 30 is attached to the inner peripheral portion of the rear surface 20b.

A method of manufacturing the semiconductor device will be described with reference to FIGS. 2A to 2F. In a process shown in FIG. 2A, the substrate 20 shaped in wafer is prepared, the semiconductor devices, the bonding pads, and the like (not shown) are formed on the substrate 20, and then the DAF 30 is attached to the rear surface 20b of the substrate 20 using a DAF attaching machine, and the DAF 30 is cut along an edge of the substrate 20. As a result, a circular DAF 30 is attached to the entire rear surface 20b of the substrate 20.

Figure 2A:
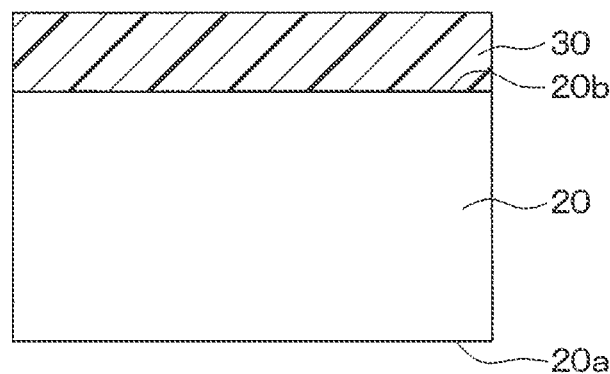
FIG. 2A is a cross-sectional view showing a process of manufacturing the semiconductor device according to the first embodiment.
Figure 2B:
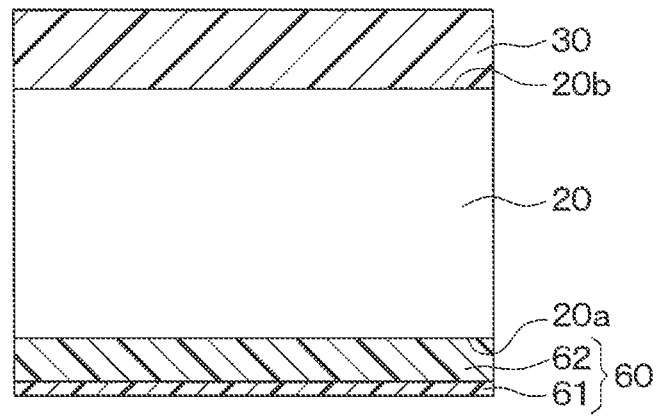
FIG. 2B is a cross-sectional view showing a process of manufacturing the semiconductor device subsequent to FIG. 2A.

In a process shown in FIG. 2B, a protective member 60 is attached to the front surface 20a of the substrate 20. In the present embodiment, the protective member 60 is configured by laminating a support layer 61 and an adhesive layer 62, which is cured by irradiation with ultraviolet rays, on each other, and the adhesive layer 62 is attached to the front surface 20a.

If a process shown in FIG. 2B is performed prior to the process shown in FIG. 2A, the DAF 30 is attached to the wafer shaped substrate 20 which is fixed to a ring. As the above method, for example, a method of cutting the DAF 30 into the same shape as the shape of the substrate 20 so as not to cut the protective member 60 after attaching the DAF 30 to the substrate 20 can be conceived. However, since the substrate 20 is thin, it is difficult to cut the DAF 30 into the same shape as the shape of the substrate 20 so as not to cut the protective member 60. In addition, a method of attaching the DAF 30 which has been processed in advance into the same shape as the shape of the substrate 20 to the substrate 20 can be conceived. However, the above method tends to cause misalignment between the substrate 20 and the DAF 30. Therefore, it is preferable to perform the process shown in FIG. 2B after the DAF 30 has been attached in the process shown in FIG. 2A.

Figure 2C:
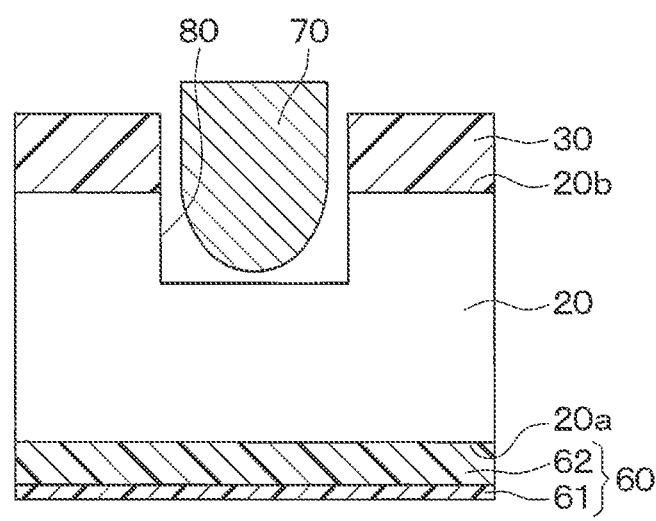
FIG. 2C is a cross-sectional view showing a process of manufacturing the semiconductor device subsequent to FIG. 2B.

In a process shown in FIG. 2C, the substrate 20 is half-cut together with the DAF 30 from the rear surface 20b with the use of a dicing blade 70. In other words, the substrate 20 is cut halfway in a thickness direction to provide a groove 80 in the substrate 20. Since Si forming the substrate 20 transmits infrared rays, alignment can be performed by observing a pattern on the front surface 20a side from the rear surface 20b side with the use of an infrared camera. The groove 80 corresponds to a rear surface side groove.

If a width of the groove 80 is small, it becomes difficult to align the position of the groove 110 provided in a process shown in FIG. 2F to be described later with the groove 80. Thus, it is preferable to increase the width of the groove 80 to some extent.

As will be described later, if a depth of the groove 80 is too large, an anti-fold strength of a portion of the substrate 20 interposed between the front surface 20a and the groove 80 may be lowered, and the substrate 20 may be cracked in the process shown in FIG. 2F. Thus, in the process shown in FIG. 2C, a thickness of the portion of the substrate 20 interposed between the front surface 20a and the groove 80, that is, a depth of the groove 110, which will be described later, is defined as H1, the depth of the groove 80 is defined as H2, and a depth H2 is set so that H1 becomes larger to some extent.

Figure 2D:
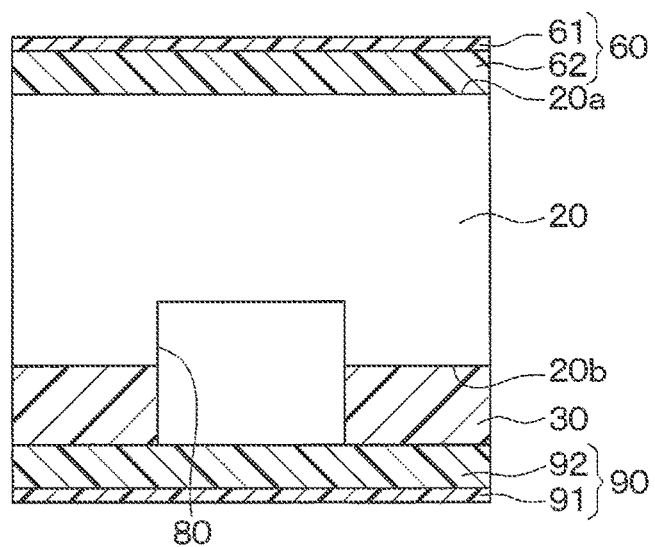
FIG. 2D is a cross-sectional view showing a process of manufacturing the semiconductor device subsequent to FIG. 2C.

In a process shown in FIG. 2D, a protective member 90 is attached to the DAF 30. In the present embodiment, the protective member 90 is configured by laminating a support layer 91 and an adhesive layer 92 which is cured by irradiating UV rays, and the adhesive layer 92 is attached to a surface of the DAF 30 opposite to the substrate 20.

Figure 2E:
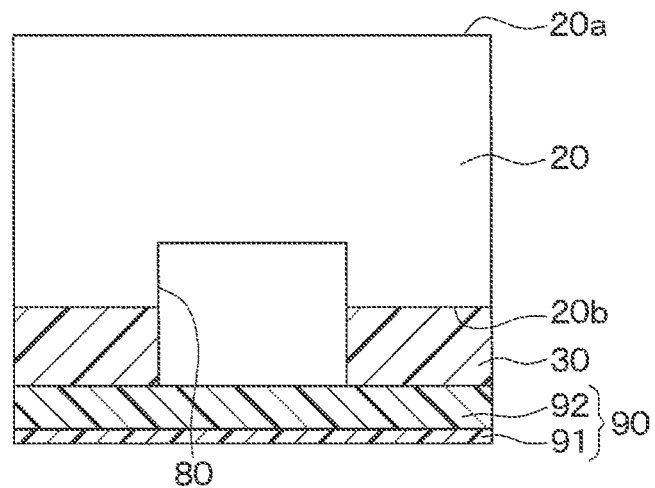
FIG. 2E is a cross-sectional view showing a process of manufacturing the semiconductor device subsequent to FIG. 2D.

In a process shown in FIG. 2E, the protective member 60 attached to the front surface 20a is irradiated with UV rays to weaken an adhesive strength of the adhesive layer 62, and the protective member 60 is peeled off from the front surface 20a. As a result, the front surface 20a is exposed.

Figure 2F:
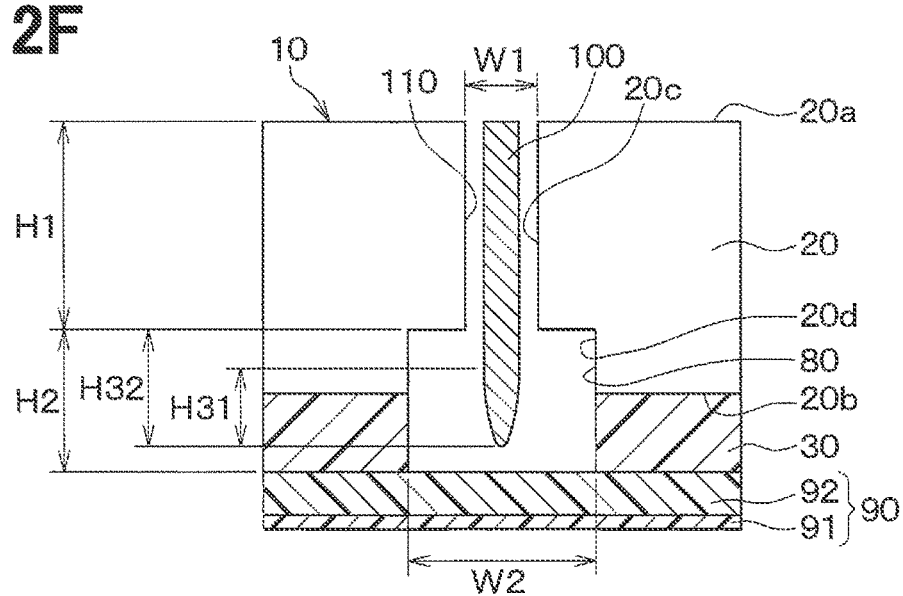
FIG. 2F is a cross-sectional view showing a process of manufacturing the semiconductor device subsequent to FIG. 2E.

In a process shown in FIG. 2F, a dicing blade 100 is used to dice the substrate 20 from the front surface 20a to provide a groove 110. The groove 110 corresponds to a front surface side groove.

In the process shown in FIG. 2F, alignment is performed with reference to a scribed line or the like formed on the front surface 20a so that the groove 110 is connected to the groove 80. The dicing blade 100 is thinner than the dicing blade 70 so that a width W1 of the groove 110 is smaller than a width W2 of the groove 80. As a result, a stepped groove is provided in which the width W1 of the groove 110 is smaller than the width W2 of the groove 80. Then, the substrate 20 is divided into chip units to form the semiconductor chip 10, and a recess portion 20d is provided in a corner between the side surface 20c and the rear surface 20b of the substrate 20.

In addition, in the process shown in FIG. 2F, the substrate 20 is cut while the dicing blade 100 and the protective member 90 are kept separated from each other so that the protective member 90 attached to the rear surface 20b is not cut.

After the process shown in FIG. 2F, the semiconductor chip 10 and the DAF 30 are separated from the protective member 90, and the semiconductor chip 10 is fixed to the mounting substrate 40 by the DAF 30. Then, wire bonding is performed, and pads (not shown) formed on the front surface 20a of the substrate 20 and the mounting substrate 40 are connected to each other by the bonding wires 50. In this manner, the semiconductor device is manufactured.

As described above, since the DAF 30 is cut while being supported from below by the substrate 20 made of Si or the like, which is harder than a dicing tape or the like, a deformation of the DAF 30 when the dicing blade 70 comes in contact with the DAF 30 can be reduced. Thus, compared with a case where the DAF 30 is cut while being supported by the dicing tape or the like, the generation of the cutting whiskers due to the DAF attaching to an uneven surface of the dicing blade can be reduced.

Figure 3:
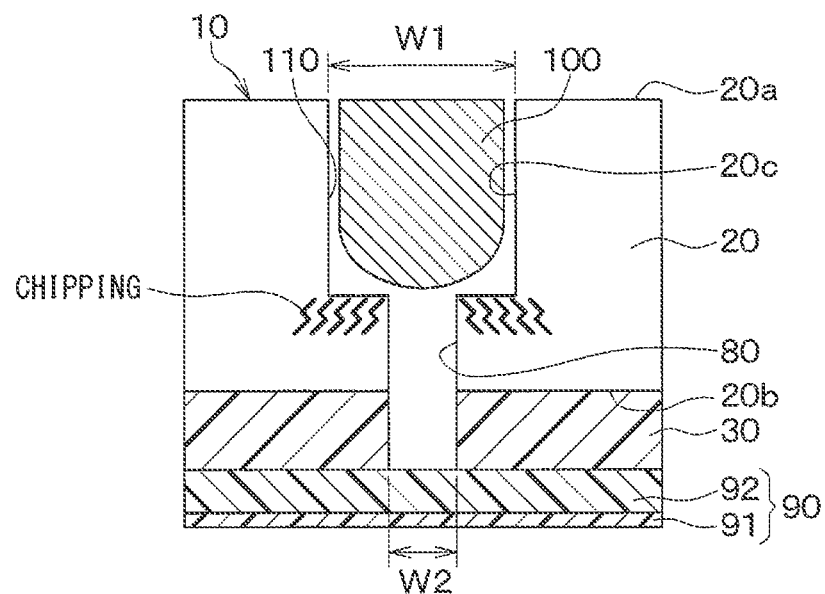
FIG. 3 is a cross-sectional view showing a state of occurrence of chipping in a comparative example.

When the width of the dicing blade 100 is larger than the width of the dicing blade 70, as shown in FIG. 3, the width W1 of the groove 110 is larger than the width W2 of the groove 80. When the groove 110 is formed in the above manner, a stress caused by a contact with the dicing blade 100 is generated in a region of the substrate 20 outside the groove 80, and chipping may be generated in a wide range. Such chipping causes cracks in the side surface 20c, thereby decreasing a strength of the substrate 20.

Figure 4:
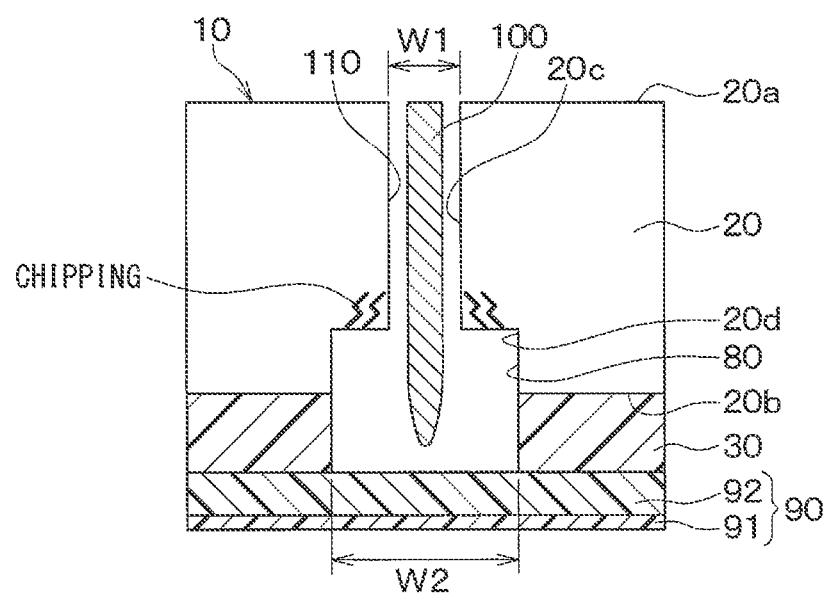
FIG. 4 is a cross-sectional view showing a state of occurrence of chipping according to the first embodiment.

On the other hand, as shown in FIG. 4, when a dicing blade having a width smaller than the width of the dicing blade 70 is used as the dicing blade 100 so that the width W1 is smaller than the width W2, the stress caused by the dicing blade 100 is released, so that the occurrence of chipping is restricted. In addition, since the occurrence of chipping outside the groove 80 is restricted, the strength of the substrate 20 can be restricted from decreasing due to cracking.

When the dicing blade 100 comes into contact with the protective member 90 during dicing, the protective member 90 is deformed, and there is a possibility that adhesive residue occurs in a periphery of the groove 80. Further, since a tip of the dicing blade is rounded with deterioration, there is a possibility a normal cutting cannot be performed at the tip portion of the dicing blade 100.

Therefore, in order to inhibit the contact between the dicing blade 100 and the protective member 90 and to perform dicing at a portion of the dicing blade 100 away from the tip portion, it is preferable to increase the depth H2 of the groove 80 to some extent. Specifically, when a length of the rounded tip portion of the dicing blade 100 is defined as H31, and a depth at which the dicing blade 100 enters the groove 80 is defined as H32, it is preferable to satisfy a relationship of H2>H32>H31. Accordingly, the normal cutting can be performed at a portion of the dicing blade 100 away from the tip portion while the dicing blade 100 and the protective member 90 are kept separated from each other.

Figure 5:
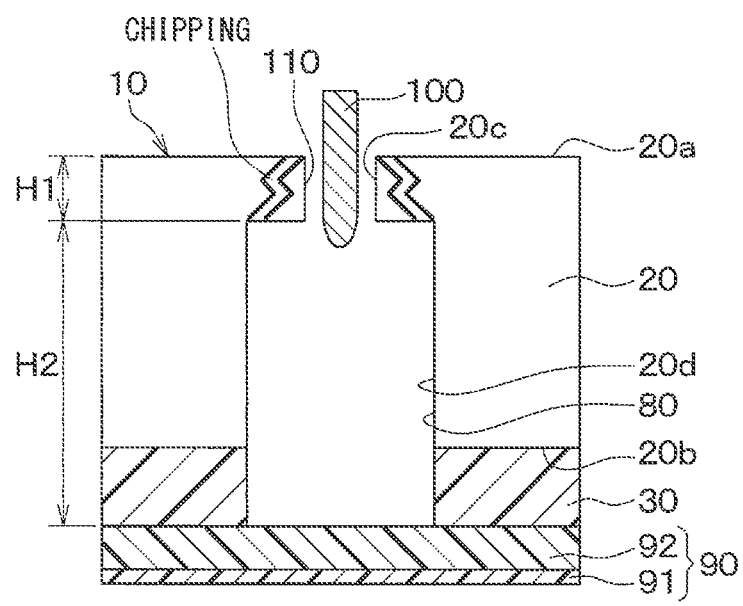
FIG. 5 is a cross-sectional view showing a state of occurrence of chipping in another comparative example.

However, if the depth H2 of the groove 80 is too large, the anti-fold strength of the portion of the substrate 20 interposed between the front surface 20a and the groove 80 is lowered, and when chipping occurs as shown in FIG. 5, the substrate 20 may be cracked by a force from the dicing blade 100. Therefore, it is preferable to reduce the depth H2 to a certain extent so that the anti-fold strength of the portion of the substrate 20 interposed between the groove 80 and the front surface 20a is higher than an anti-fold strength at which the substrate 20 cracks in the process shown in FIG. 2F.

The anti-fold strength of the substrate 20 varies depending on the width W2 of the groove 80 and the material of the substrate 20 in addition to the depth H2. Further, since the anti-fold strength of the substrate 20 when chipping occurs also changes depending on the width of the dicing blade 100 or the like, it is preferable to set the depths H1, H2, and W2 in consideration of the material of the substrate 20, the width of the dicing blade 100, and so on.

Second Embodiment

A second embodiment will be described. Since the present embodiment is the same as the first embodiment except that the shape of the substrate 20 is changed with respect to the first embodiment, only portions different from the first embodiment will be described.

Figure 6:
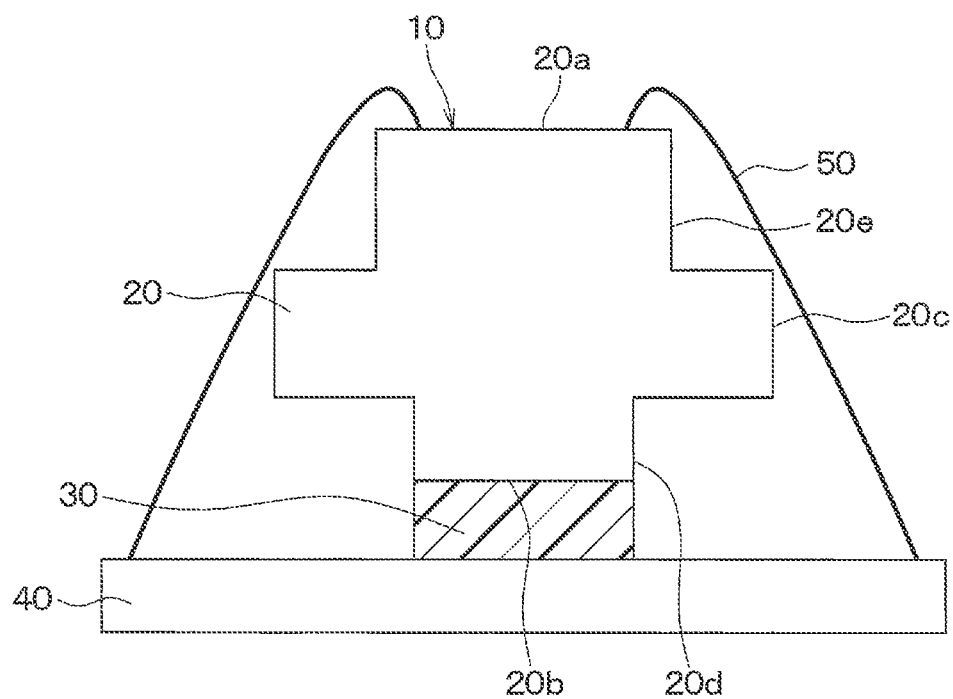
FIG. 6 is a cross-sectional view of a semiconductor device according to a second embodiment.

As shown in FIG. 6, in the present embodiment, a recess portion 20e is provided in a corner between a front surface 20a and a side surface 20c of the substrate 20, and an outer peripheral end portion of the front surface 20a is shaped to be recessed from the inner peripheral portion. As a result, a portion extending from the inner peripheral portion of the front surface 20a to an inner peripheral portion of a rear surface 20b through an outer peripheral portion of the front surface 20a, the side surface 20c, and an outer peripheral portion of the rear surface 20b has a stepped shape. Bonding wires 50 are connected to the inner peripheral portion of the front surface 20a.

In the present embodiment, similarly to the first embodiment, after the process shown in FIG. 2A to the process shown in FIG. 2E have been performed, another groove having an opening width smaller than an opening width of one groove is provided in a bottom of the one groove so that the groove 110 has a stepped shape whose width decreases toward the rear surface 20b.

Figure 7A:
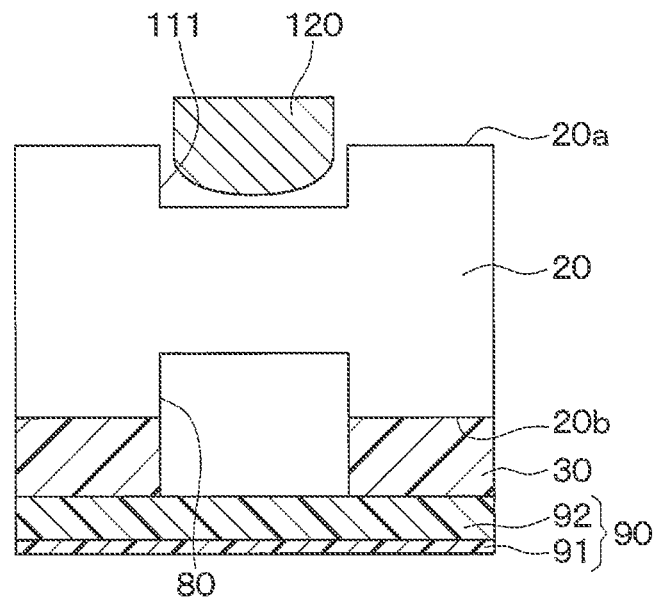
FIG. 7A is a cross-sectional view showing a process of manufacturing the semiconductor device according to the second embodiment.
Figure 7B:
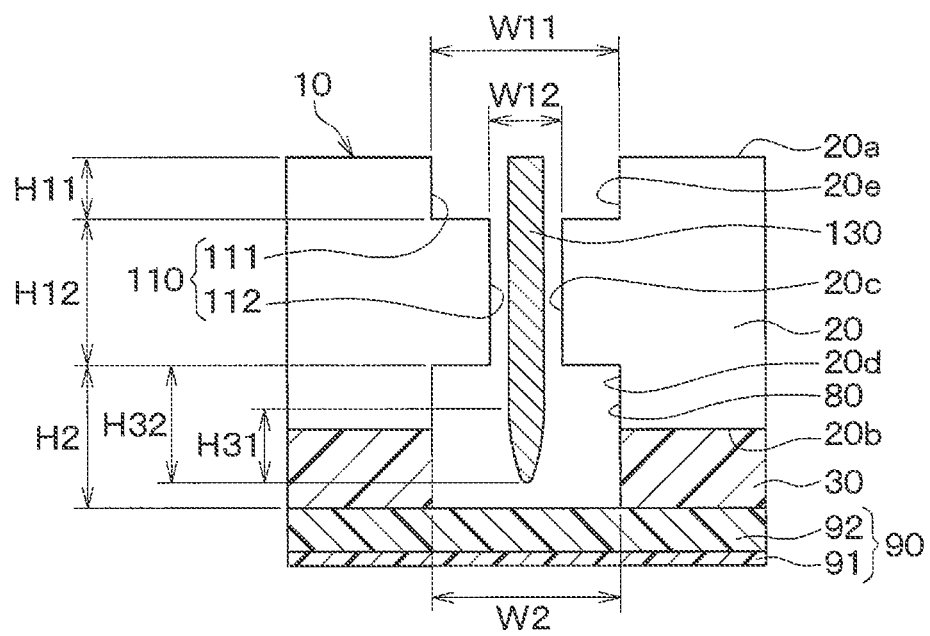
FIG. 7B is a cross-sectional view showing a process of manufacturing the semiconductor device subsequent to FIG. 7A.

More specifically, alignment is performed with reference to a scribe line or the like formed on the front surface 20a of the substrate 20, and as shown in FIG. 7A, the dicing blade 120 is placed in accordance with the groove 80 provided on the rear surface 20b, thereby providing a groove 111 in the front surface 20a. As shown in FIG. 7B, a dicing blade 130 is used to provide a groove 112 at a bottom of the groove 111. At that time, the respective widths of the grooves 111 and 112 are set to W11 and W12, and the dicing blade 130 having a width smaller than a width of the dicing blade 120 is used so that the width W12 is smaller than the width W11. The grooves 111 and 112 correspond to first and second front surface side grooves, respectively.

Accordingly, the groove 110 having a stepped shape are provided by the groove 111 and the groove 112, and the groove 110 is connected to the groove 80 at the groove 112. Then, the substrate 20 is divided into chips, the recess portion 20d is formed at the corner between the rear surface 20b and the side surface 20c of the substrate 20, and the recess portion 20e is provided at the corner between the front surface 20a and the side surface 20c.

In the present embodiment, as in the first embodiment, it is preferable to increase the width W2 of the groove 80 to some extent in order to facilitate the alignment of the groove 111, the groove 112, and the groove 80. In order to inhibit the occurrence of chipping and cracks, it is preferable that the width W12 of the groove 112 is set to be smaller than the width W2 of the groove 80.

In addition, similarly to the first embodiment, it is preferable that H2>H32>H31 is satisfied in order to perform a normal cutting at a portion of the dicing blade 130 away from the tip portion while maintaining the state where the dicing blade 130 and the protective member 90 are separated from each other. In addition, it is preferable that the depth H2 is set to be small to some extent so that the anti-fold strength of the portion of the substrate 20 interposed between the groove 80 and the front surface 20a becomes higher than the anti-fold strength at which the substrate 20 cracks in the process shown in FIG. 7A. In addition, it is preferable that the depths H11 and H2 are reduced to some extent so that the anti-fold strength of the portion of the substrate 20 interposed between the groove 80 and the groove 111 is higher than the anti-fold strength at which the substrate 20 cracks in the process shown in FIG. 7B.

Figure 8:
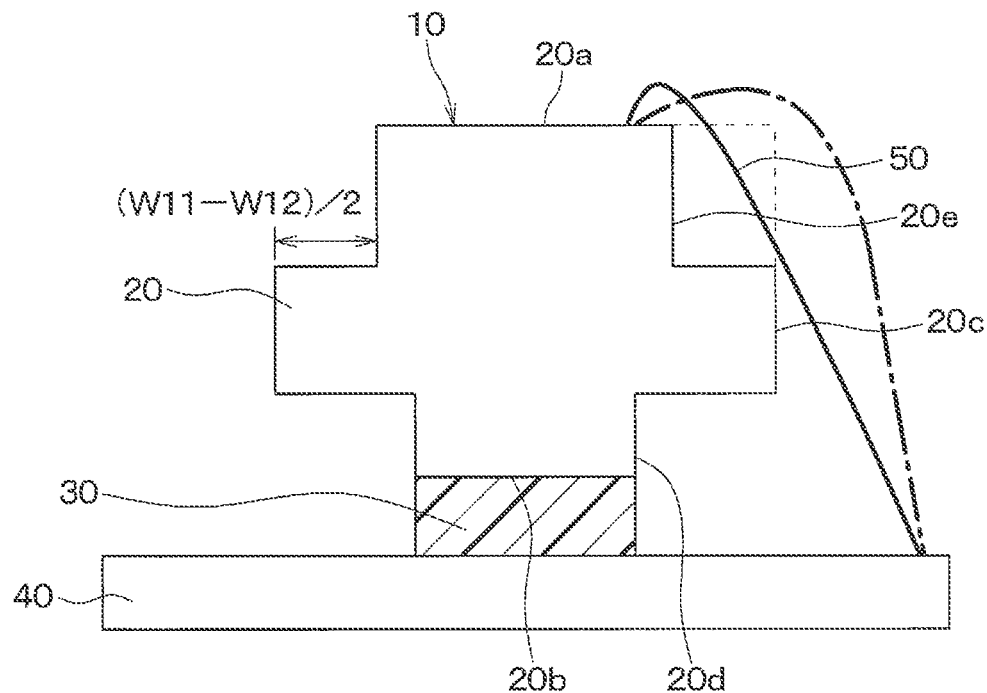
FIG. 8 is a cross-sectional view illustrating effects of the second embodiment.

In the present embodiment in which the recess portion 20e is provided in the substrate 20, as shown in FIG. 8, a wire looping can be reduced more than that in the first embodiment by an amount corresponding to the absence of the corner between the front surface 20a and the side surface 20c. Accordingly, the bonding wires 50 can be shortened. In addition, since the bonding wires 50 are shortened, the strength of the bonding wires 50 can be improved. In FIG. 8, a dashed line indicates a shape of the corner of the substrate 20 according to the first embodiment, and a one-dot chain line indicates a shape of the bonding wire 50 according to the first embodiment.

Even when the recess portion 20e is not provided in the substrate 20, the bonding wires 50 can be shortened by bringing the position of the bonding pads (not shown) formed on the front surface 20a close to an end of the substrate 20. However, when the bonding pads are disposed in this manner, the bonding wires 50 are greatly bent, and the strength of the bonding wires 50 is lowered. On the other hand, according to the present embodiment in which the recess portion 20e is provided in the substrate 20, the pad positions on the mounting substrate 40 can be brought close to the end of the substrate 20 while reducing the deformation of the bonding wires 50, thereby being capable of performing high-density mounting.

Third Embodiment

A third embodiment will be described. Since the present embodiment is the same as the second embodiment except that the configuration of the substrate 20 is changed with respect to the second embodiment, only portions different from the second embodiment will be described.

Figure 9:
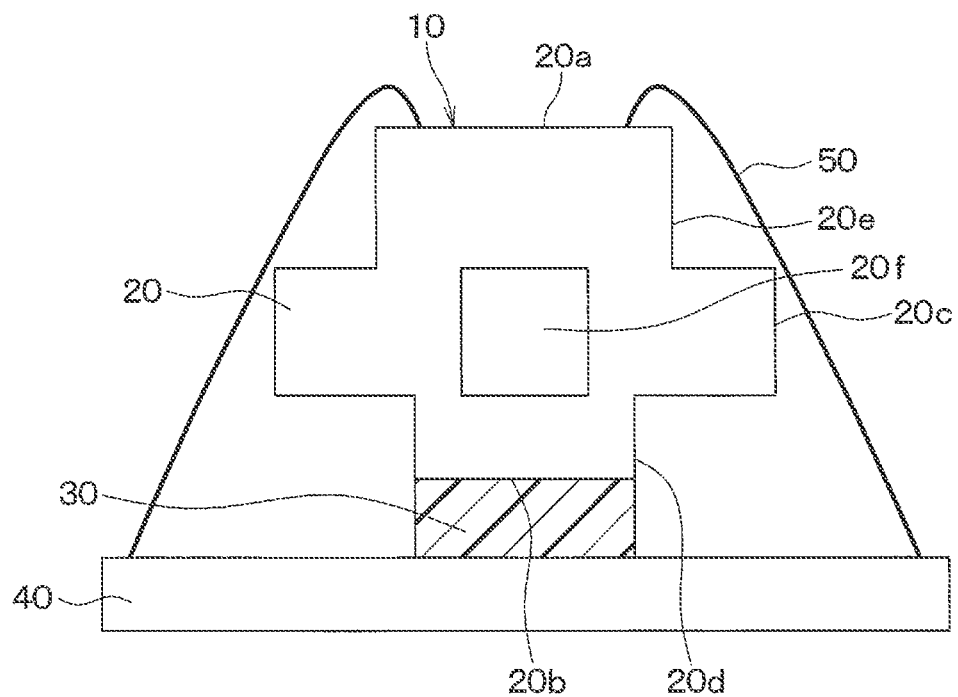
FIG. 9 is a cross-sectional view of a semiconductor device according to a third embodiment.
Figure 10:
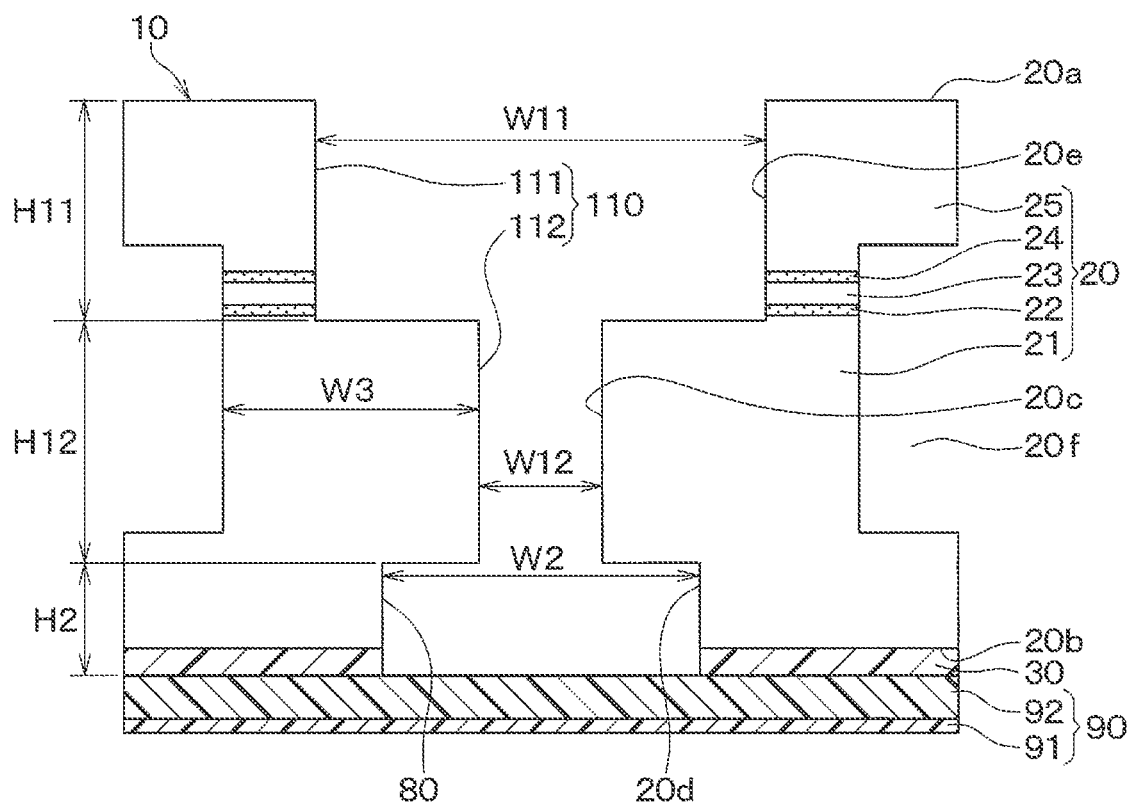
FIG. 10 is a cross-sectional view showing a process of manufacturing the semiconductor device according to the third embodiment.

As shown in FIG. 9, according to the present embodiment, a hollow portion 20f is defined inside the substrate 20. Such a substrate 20 may have a configuration in which an Si layer 21, an oxide film 22, an Si layer 23, an oxide film 24, and an Si layer 25 are stacked in a stated order as shown in FIG. 10.

In the hollow portion 20f, a sensor unit (not shown) for detecting acceleration or the like is formed. Each bonding wire 50 connects a bonding pad (not shown) connected to the Si layer 23 by a TSV (not shown) formed on the Si layer 25 and a bonding pad (not shown) on the mounting substrate 40.

In the present embodiment, prior to the process shown in FIG. 2A, a front surface of the Si layer 21 is thermally oxidized to form the oxide film 22, a portion of the Si layer 21 and the oxide film 22 is removed by etching to provide a recess portion, and the Si layer 23 is bonded to the Si layer 21 through the oxide film 22. Then, a sensor unit (not shown) is formed in the Si layer 23. In addition, the oxide film 24 is formed on a front surface of the Si layer 25, a recess portion is provided by removing parts of the Si layer 25 and the oxide film 24 by etching, and the Si layer 25 is bonded to the Si layer 23 through the oxide film 24 to form the TSV and the bonding pads (not shown) on the Si layer 25. In this manner, the substrate 20 in which the hollow portion 20f is provided is manufactured. After the process shown in FIG. 2A to the process shown in FIG. 2E have been performed, the groove 110 having the stepped shape is provided as shown in FIG. 10. In the present embodiment, in the process shown in FIG. 2C, the hollow portion 20f and the patterns on the front surface 20a can be observed from a position toward the rear surface 20b with the use of an infrared camera to perform alignment.

When the substrate 20 includes a plurality of layers made of different materials, it is desirable to select a dicing blade according to the materials. As shown in FIGS. 7A and 7B, the groove 110 is provided by dicing multiple times, thereby being capable of improving the degree of freedom of the dicing condition.

When the hollow portion 20f is provided inside the substrate 20, the anti-fold strength of the substrate 20 decreases as the width W3 of the portion of the substrate 20 interposed between the groove 112 and the hollow portion 20f decreases. Therefore, in order to inhibit the decrease in the anti-fold strength of the substrate 20, it is desirable to increase the width W3 to some extent.

Other Embodiments

It should be noted that the present disclosure is not limited to the embodiments described above, and can be modified as appropriate. The above embodiments are not independent of each other, and can be appropriately combined except when the combination is obviously impossible. In each of the above embodiments, it is needless to say that the elements configuring the embodiments are not necessarily indispensable except when it is clearly indicated that the elements are particularly indispensable, when the elements are clearly considered to be indispensable in principle, and the like. In the above-described respective embodiments, when numerical values such as the number, figures, quantity, a range of configuration elements in the embodiments are described, the numerical values are not limited to a specific number, except when the elements are particularly specified as indispensable and the numerical values are obviously limited to the specific number in principle. Further, in each of the above-mentioned embodiments, when referring to the shape, positional relationship, and the like of a component and the like, the component is not limited to the shape, positional relationship, and the like, except for the case where the component is specifically specified, the case where the component is fundamentally limited to a specific shape, positional relationship, and the like.

For example, the first embodiment may be applied to a semiconductor device including the substrate 20 in which the hollow portion 20f is formed.

Further, in the second embodiment, the groove 110 is configured by the groove 111 and the groove 112 and has the stepped shape of two steps, but the groove 110 may have a stepped shape of three or more steps. In other words, after the process shown in FIG. 2E has been performed, another groove having an opening width smaller than an opening width of one groove may be provided in the bottom of one groove multiple times so that the groove 110 has a stepped shape whose width decreases toward the rear surface 20b.

What is claimed is:

1. A manufacturing method of a semiconductor device including a substrate having a front surface and a rear surface, and a film attached to the rear surface, the manufacturing method comprising:
    attaching the film on the rear surface;
    providing a rear surface side groove by half-cutting the substrate from the rear surface together with the film;
    attaching a protective member to the film after the providing the rear surface side groove; and
    providing a front surface side groove connected to the rear surface side groove by dicing the substrate from the front surface after the attaching the protective member, wherein
    in the providing the rear surface side groove, the half-cutting the substrate is performed to cause an anti-fold strength of a portion of the substrate interposed between the rear surface side groove and the front surface to be higher than an anti-fold strength at which the substrate cracks when the front surface side groove is provided.

2. A manufacturing method of a semiconductor device including a substrate having a front surface and a rear surface, and a film attached to the rear surface, the manufacturing method comprising:
    attaching the film on the rear surface;
    providing a rear surface side groove by half-cutting the substrate from the rear surface together with the film;
    attaching a protective member to the film after the providing the rear surface side groove; and
    providing a front surface side groove connected to the rear surface side groove by dicing the substrate from the front surface after the attaching the protective member, wherein
    the providing the front surface side groove includes providing a first front surface side groove, and then providing a second front surface side groove having a width smaller than a width of the first front surface side groove in a bottom of the first front surface side groove to cause the front surface side groove to have a stepped shape whose width decreases toward the rear surface.

3. The manufacturing method according to claim 2, wherein
    in the providing the front surface side groove, the first front surface side groove is provided from the front surface of the substrate, and then the second front surface side groove having the width smaller than the width of the first front surface side groove is provided in the bottom of the first front surface side groove to be connected to the rear surface side groove.

4. The manufacturing method according to claim 2, wherein
    in the providing the front surface side groove, the second front surface side groove is provided to have the width smaller than a width of the rear surface side groove.

5. The manufacturing method according to claim 2, wherein
    the providing the front surface side groove further includes providing a third front surface side groove having a width smaller than the width of the second front surface side groove in a bottom of the second front surface side groove to be connected to the rear surface side groove, and
    the third front surface side groove is provided to have the width smaller than a width of the rear surface side groove.

6. The manufacturing method according to claim 2, wherein
    in the providing the front surface side groove, the first front surface side groove is provided to have the width smaller than a width of the rear surface side groove.

7. The manufacturing method according to claim 2, wherein
    in the providing the front surface side groove, the providing the first front surface side groove is performed to cause an anti-fold strength of a portion of the substrate interposed between the rear surface side groove and the first front surface side groove to be higher than an anti-fold strength at which the substrate cracks when the second front surface side groove is provided in the bottom of the first front surface side groove.

8. The manufacturing method according to claim 2, wherein
    in the providing the front surface side groove, the dicing is performed in a state where a dicing blade and the protective member are separated from each other.

9. The manufacturing method according to claim 2, wherein in the providing the front surface side groove, the dicing is performed with a dicing blade, and in the providing the rear surface side groove, the rear surface side groove is provided to have a depth greater than a length of a rounded tip portion of the dicing blade.

* * * * *